(12) United States Patent
Portmann et al.

(10) Patent No.: US 8,779,953 B1
(45) Date of Patent: Jul. 15, 2014

(54) FAST TEST OF DIGITAL-TO-ANALOG CONVERTERS

(71) Applicant: Google Inc., Mountain View, CA (US)

(72) Inventors: Clemenz Portmann, Los Altos, CA (US); Shahriar Rabii, Palo Alto, CA (US); Donald Charles Stark, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 13/955,499

(22) Filed: Jul. 31, 2013

(51) Int. Cl.
*H03M 1/10* (2006.01)

(52) U.S. Cl.
USPC .................................. 341/120; 341/144

(58) Field of Classification Search
USPC .................................. 341/120, 144
See application file for complete search history.

(56) References Cited

U.S. PATENT DOCUMENTS

| | | | | |
|---|---|---|---|---|
| 5,841,382 A | * | 11/1998 | Walden et al. | 341/120 |
| 5,955,980 A | * | 9/1999 | Hanna | 341/120 |
| 6,650,266 B1 | * | 11/2003 | Tester | 341/144 |
| 7,026,967 B2 | * | 4/2006 | Eloranta | 341/120 |
| 7,167,117 B2 | | 1/2007 | Choe | |
| 7,773,011 B2 | | 8/2010 | Sahu et al. | |
| 7,791,519 B2 | | 9/2010 | Matsukawa et al. | |

\* cited by examiner

*Primary Examiner* — Khai M Nguyen

(74) *Attorney, Agent, or Firm* — Morris & Kamlay LLP

(57) ABSTRACT

A method and device for testing a digital-to-analog converter is provided. The method may include configuring a decoder to address an individual unit cell of a plurality of unit cells of a digital-to-analog converter. The configured decoder may select a particular unit cell of the plurality of unit cells for testing. The selected unit cell may have digital and analog circuitry. A bias current of the selected unit cell may be increased. The increased bias current of the selected unit cell may be greater during the testing than during normal operation. A test logic signal may be applied to the selected unit cell. In response to the test logic signal, an output signal may be output from the selected unit cell logic circuitry of the digital-to-analog converter. A device may include logic circuitry configured to select an individual unit cell for testing and a current generating circuitry.

16 Claims, 5 Drawing Sheets

300

400

500

FAST TEST OF DIGITAL-TO-ANALOG CONVERTERS

BACKGROUND

Test costs for testing the analog signal output of a digital-to-analog converter may contribute substantially to the overall cost of integrated circuits. Cost can be related to, for example, the type of tester used and the testing time on the tester. When generating an analog signal in response to changes in a digital code, the electronic circuits that generate the analog signal take time, known as "settling time," to respond to the changes in the digital code. As a result, testing of the analog circuits may take additional time because the test device waits a "settling time" for each cell of a digital-to-analog converter (DAC) to generate an accurate output.

Although the "settling time" is not a significant amount of time in isolation, when the "settling time" of a number of cells under test is aggregated, the amount of time can be substantial. The extra testing time when multiplied by an hourly cost for a test device can result in substantial extra costs. In addition, equipment necessary for measuring millivolts and microvolts must have high precision to discern the differences between an accurate output and an inaccurate output.

BRIEF SUMMARY

According to an implementation of the disclosed subject matter, a method is provided that may include configuring a decoder to address an individual unit cell of a plurality of unit cells of a digital-to-analog converter. The configured decoder may select a particular unit cell of the plurality of unit cells for testing. The selected unit cell may have logic circuitry and analog circuitry. The selected unit cell may be tested by increasing a bias current of the selected unit. The increased bias current of the selected unit cell may be greater during the testing than during normal operation. A test logic signal may be applied to the logic circuitry of the selected unit cell. In response to the test logic signal, an output signal may be output from the selected unit cell logic circuitry of the digital-to-analog converter.

According to an implementation of the disclosed subject matter, a device is provided that may include a plurality of unit cells arranged in an array of rows and columns. Coupled to the array of unit cells may be a dynamically configurable row decoder. The row decoder may have a row code input and logic circuitry. A dynamically configurable column decoder that may be coupled to a column code input and logic circuitry to the array of unit cells. A voltage generator may be coupled to the plurality of unit cells and to a device output terminal. A logic test input may be coupled to the row decoder and the column decoder.

Additional features, advantages, and implementations of the disclosed subject matter may be set forth or apparent from consideration of the following detailed description, drawings, and claims. Moreover, it is to be understood that both the foregoing summary and the following detailed description includes examples and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

Aspects of the disclosure relate to a more time efficient process and system for testing the operation of a digital-to-analog converter (DAC). DACs may include digital and analog circuits. Implementations of the described process reduces DAC testing time because input response time of the DAC digital logic is faster in comparison to the response time of analog circuitry of the DAC. The details of which will be explained further with reference to the figures. By sensing only the digital circuit outputs, parts of the DAC can be screened very quickly for logic failures. The logic failures are more readily detected than deficiencies associated with the analog output from the respective parts of a DAC. In addition, the testing devices for monitoring the test results according to described implementations may have a lower precision due to the sensing of either logic highs or lows. As a result, both total testing time and testing costs can be reduced.

Figure 1:
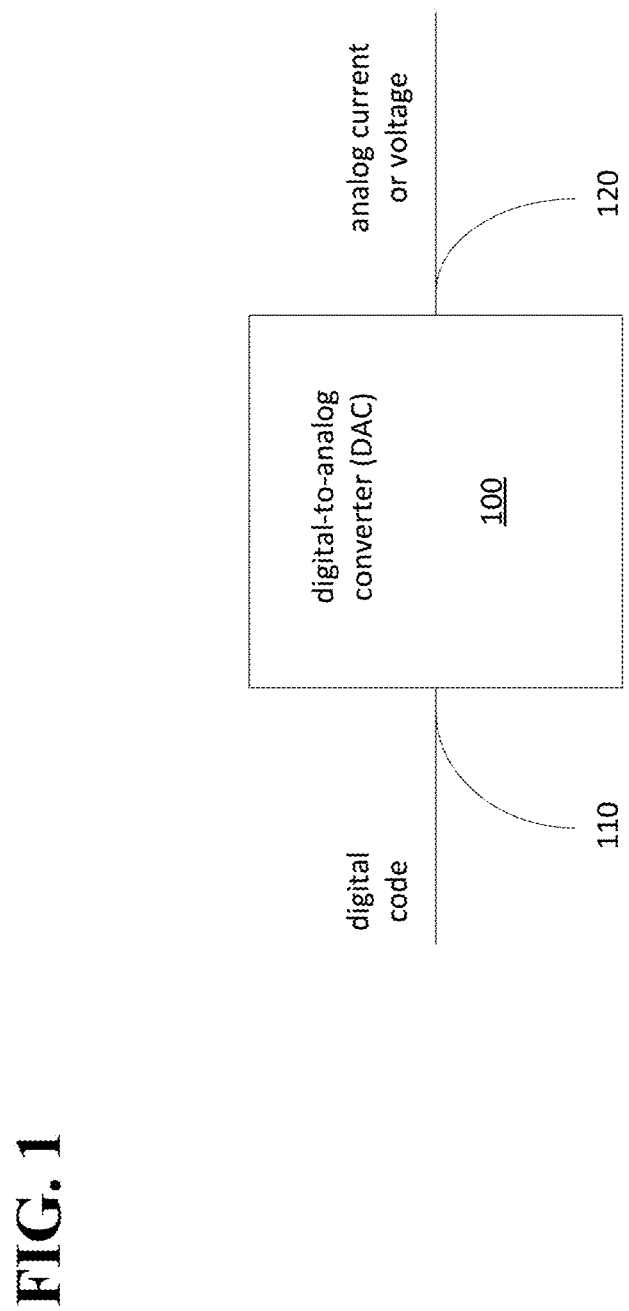
FIG. 1 shows a digital-to-analog converter according to an implementation of the disclosed subject matter.

FIG. 1 illustrates an example implementation of a DAC 100. The DAC 100 may have one or more inputs 110 and one or more outputs 120. In an example implementation, the one or more inputs 110 may be configured to receive a code (e.g., one or more bits of a digital input and/or code). The one or more outputs 120 may be configured to provide a current (e.g., an analog current) and/or a voltage (e.g., an analog voltage) that may correspond to the code received by the one or more inputs 110.

In operation, the DAC 100 may receive the code at the input 110. In response to the received code, the DAC 100 may provide a corresponding current (and/or voltage) on the output 120. In an example implementation, as the code increases in discrete values, the current provided on the output 120 may also increase in corresponding discrete values. As the code decreases in discrete values, the current provided on the output 120 may also decrease in correspondence with the discrete code values.

Figure 2:
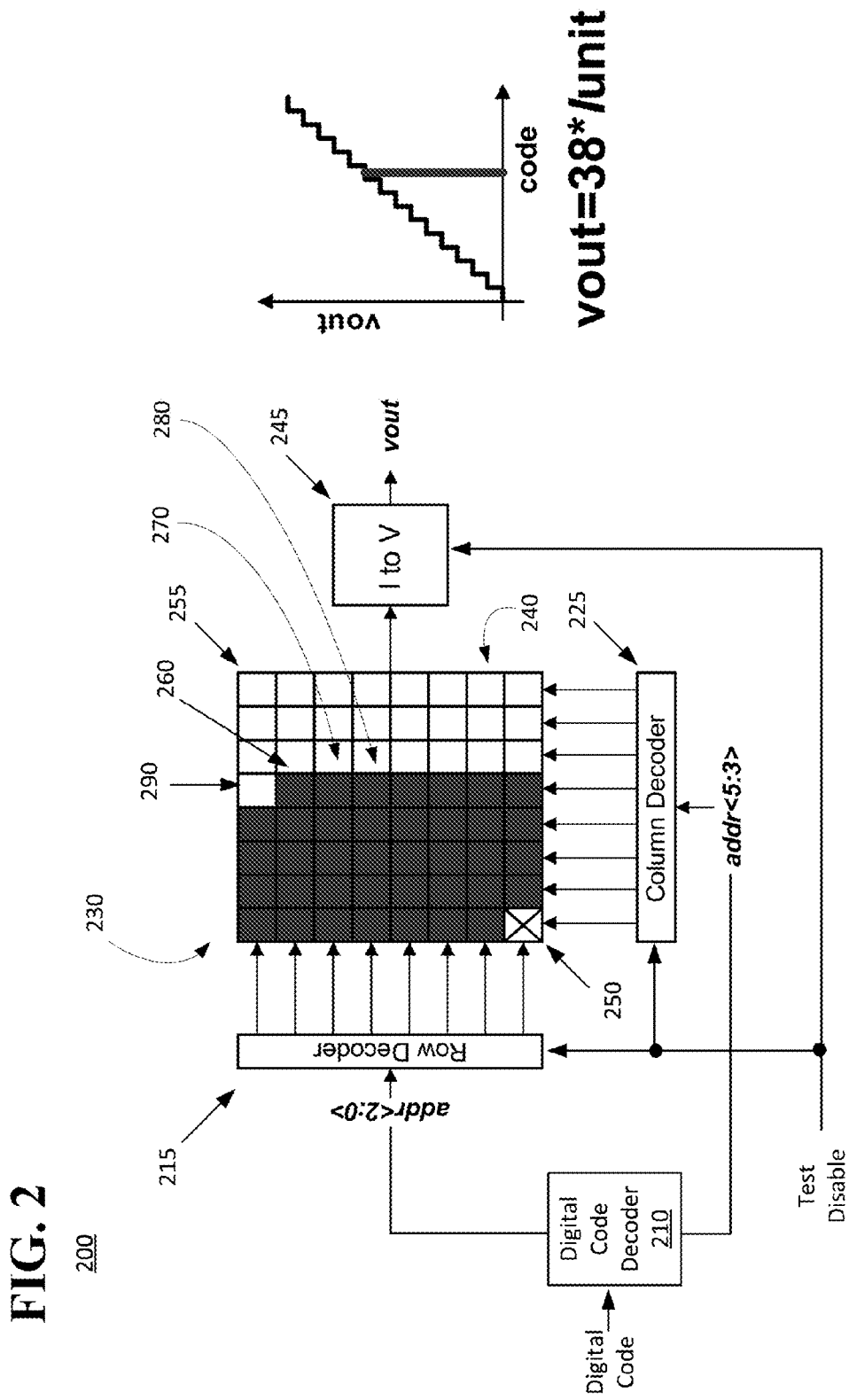
FIG. 2 shows an example of the operation of a digital-to-analog converter according to an implementation of the disclosed subject matter.

FIG. 2 illustrates an example implementation of an array 230 of current elements 240 (e.g., current cells) in a fully-segmented, or current-steering digital-to-analog converter (DAC) 200. The DAC 200 may include a digital code decoder 210, row decoder circuits 215, column decode circuits 225, a current element array 230, a current-to-voltage converter 245, and inputs and outputs. In the example, the array 230 has R+1 rows and C+1 columns of current elements 240. The respective current elements 240 may output a unit value of current in which the units may be nanoamperes, microamperes, milliamperes and the like. Each current element 240 may be called a unit cell. For a current-steering DAC array 230, for example, the individual unit cells 240 may include a circuit in a current-steering configuration; decode logic, and outputs to a current-to-voltage conversion circuit, such as a resistor. Unit cells, usually $2^n$ for an n-bit DAC, are configured in an array coupled with row and column decoders to provide addressing of individual unit cells.

The operation of the DAC may have two modes: normal and test. Normal mode, which is shown in FIG. 2, may be set by having no signal or a "test disable" signal applied to the row 215 and column 225 decoders and the current-to-voltage converter 245 through a test signal path. The test mode may be set by applying a "test enable" signal through the test signal path. In normal operation of the DAC 200, the output of the array 230 may be I unit*k, where I unit is a unit current value and k is a number between 0 and $2^n-1$. The output is accomplished by turning on k unit cells. Each unit cell 240 may be individually addressed. For example, cell 250 may be a blank cell that is located at row 0 and column 0. Cell 250 may be left blank because it is not intended to contribute any current as its contribution to the current is supposed to be zero (0). In another example, unit cell 260 may be addressed as row 2 and column 5. For example, blank cell 250 may be addressed when the input code 000000 is input to the digital code decoder 210, which may result in a current output of, for example, 0 microamperes. In an example implementation, each unit cell 240 of current array 230 may be configured to provide the same current when the respective current element is turned on. For example, each unit cell 240 may have a current output of about 1.0 microamperes. Unit cell 255 may be addressed, for example, when input code 111111 is input into the digital code decoder 210, which may result in a current output of, for example, 63 microamperes may be provided to the current-to-voltage converter 245 because each of the 63 unit cells may output an I unit current of 1 microampere. The provided unit current (I unit) output from unit cell 240 may be added to the units of current provided by the other unit cells 240 that are also turned on. Thus, for example, if 38 current elements are turned on, then the array 230 of unit cells 240 can provide 38 units of combined current. If, for example, the units for the current are microamperes, the combined current may be about 38 microamperes. If a particular unit cell 290 is turned off or remains off, then the particular unit cell 290 does not contribute current to the output of the array 230 or the DAC 200. In another example implementation, the unit cells 240 may be configured to provide weighted or scaled units of current when turned on, such as fractional values between 0 and 1, values greater than 1, or values greater than 1 including fractional values.

When generating an analog signal, a digital code may be input to the DAC 200 at digital code decoder 210 and may be used to determine which of the current elements will be turned on. The digital decoder 210 may accept a 6-bit digital code ([5:0]) and may have digital logic circuitry to identify a specific row and column address for turning "ON" a particular unit cell. Various types of decoder configurations may be used. For example, digital logic may use the three most significant bits [2:0] of the 6 bit input code to determine a row address for a particular unit cell to turn "ON," and the next three significant bits [5:3] may identify the column address. In the illustrated example, the digital code may be decoded by decoder 210 to turn on the lead-most unit cell 260. As a result, lead-most unit cell 260 may provide a unit of current for the output of the array 230 or the DAC 100. In response to the individual address signals, the lead-most unit cell 260 may turn on the unit cell 270 that is "behind" current element 260. In the illustrated example, the current element that is the next current element "behind" unit cell 260 may be hard-wired.

The next, or "behind" unit cell 270 may also provide a unit of current that is combined with the unit of current provided by the lead-most unit cell 160 and a summed current (e.g., two units of current) may be provided to the output of the array 230 or the DAC 200. The turned-on unit cell 270, in turn, may turn on the unit cell 280 that is "behind" the current element 270. The process continues, in which each turned-on current element turns on the current element "behind" it and provides an additional unit of current to the summed current provided on the output of the array 230 or the DAC 100, until unit cell 250 (i.e., the "last" current element 250 in the array 230) is turned on and provides an additional unit of current for the summed current provided on the output of the array 230 or the DAC 100. The unit cells 240 in "front" of the lead-most unit cell 260 are not turned on or remain off, and do not contribute to the sum of unit currents on the output of the array 230 or the DAC 200. After some time, an analog voltage value corresponding to the inputted digital code will be output from the current-to-voltage converter 245.

As the digital code input changes value, the analog output value that corresponds to the digital code input value must also change. When the analog current output circuits of the respective cells turn "ON", such as unit cells 270 and 280, to produce an analog current output, the response time for the electronic components (e.g., transistors) in each current element to arrive at a steady-state output may take a few milliseconds. As a result, there is a time delay between the time the digital input code is applied to the digital code decoder 210 and an analog output signal is output from the voltage converter 245.

Figure 3:
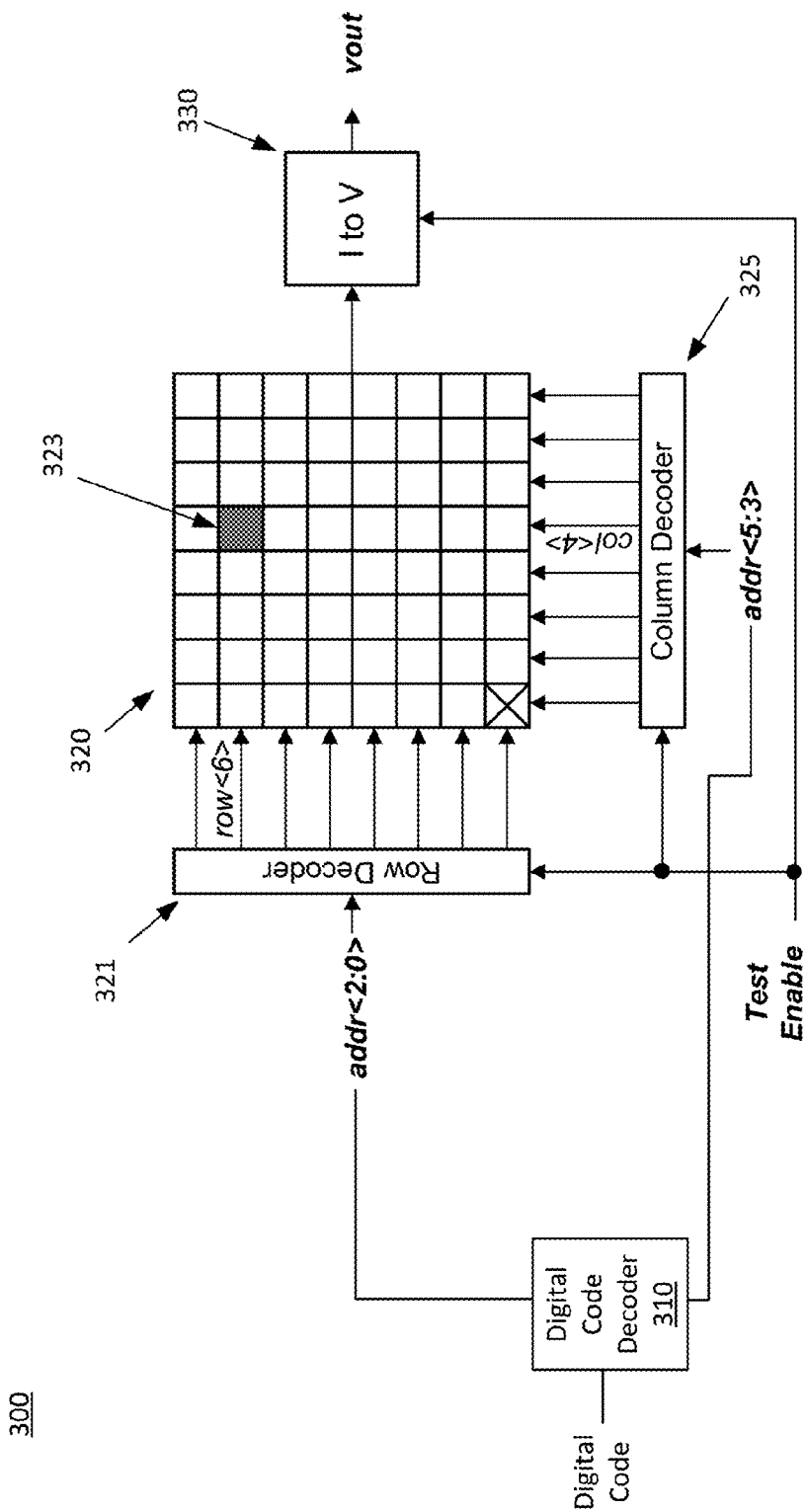
FIG. 3 shows a digital-to-analog converter in a test mode according to an implementation of the disclosed subject matter.

FIG. 3 shows a digital-to-analog converter in a test mode according to an implementation of the disclosed subject matter. The illustrated digital-to-analog converter 300 may include a digital code decoder 310, a row decoder 321, a column decoder 325, a unit cell array 320 and a current-to-voltage converter 330. The digital-to-analog converter 300 may be, for example, a current-steering digital-to-analog converter. Of course, other types of DACs that have digital logic may be used. The digital code decoder 310 may include digital logic in a suitable configuration to provide individual unit cell addressing. For example, the digital code decoder 310 may be configured to include a pair of one-hot decoder outputs that address an individual row and individual column. The test mode may be implemented by applying a "test enable" signal to a test signal input. The "test enable" signal may be provided to one or more of the row decoder 321, the column decoder 325 and the current-to-voltage converter 330. For a current-steering DAC array, for example, efficient testing of the individual unit cell digital logic can be accomplished by addressing each cell individually and reading a digital value at the output of the DAC.

In the illustrated example, a single cell may be enabled by having an additional "test" signal that may change the function of the selected unit cell 323 (and/or perhaps the row and column decoders 321, 325). As described above with respect to FIG. 2 in "Normal" operation mode, the ripple signal enables all previous cells to turn on in a sequential fashion. However, in the "Test" mode, the cell logic is modified by the application of the "test enable" signal interrupt, which interrupts the ripple signal by breaking the signal path to the subsequent or "behind" unit cells. As a result, a single unit cell can be enabled, such as unit cell 323 and its output sent to the current-to-voltage converter 330. When addressed, the output of the single unit cell may only be the signal from the digital logic circuitry with no signal being output from the analog circuitry of the unit cell. Other types of decoders for different implementations may be configured to accept a test signal to provide single cell addressing.

A single unit cell may be enabled by having an additional "test" signal that changes the function of the cell (and/or row and column) decoders. In addition to applying the "test enable" signal to place the decoder to address a single cell, the test mode may include additional control signals that configure circuits within the DAC 300. The additional control signals may be applied that modify the parameters of current supply circuits (not shown), row decoders, column decoders, output circuits and the like. For example, the current gain of individual unit cells, such as unit cell 323, may be modified such that a single unit cell may generate an output signal having a magnitude large enough to generate the equivalent of a full digital value output voltage, such as 1.0 volt, 1.2 volts, 2.5 volts, 3.3 volts and 5 volts, at the DAC output(s), or, more generally, a voltage in the range of approximately 3 to approximately 5 volts.

In a test mode implementation, each individual unit cell may be turned "ON". For example, the digital code applied to the digital code decoder 310 may be decoded by the row decoder 321 to signal row 6 as the active row and be decoded by the column decoder 325 to signal column 4 as the active column. As a result, unit cell 323 at the intersection of active row 6 and active column 4 may be enabled. The operation of the DAC 300 in test mode will be explained in more detail with reference to FIG. 4.

In an implementation in which a DAC may have differential outputs, complement signals may be used for row and column decoders to address a single cell in the complement space (e.g., 11111011 & 11110111 to address row <5> and column <4>, respectively) and the complementary DAC output (e.g., out_n) can be observed to confirm proper operation.

Figure 4:
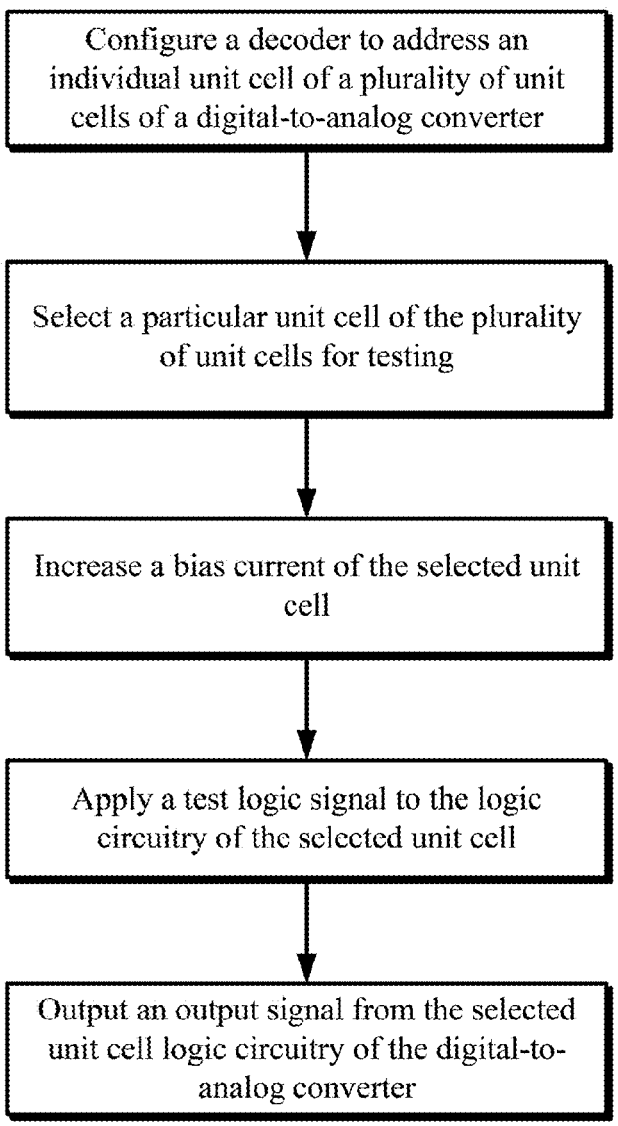
FIG. 4 shows a process for testing a digital to analog converter according to an implementation of the disclosed subject matter.

FIG. 4 shows a process flowchart for testing a digital to analog converter according to an implementation of the disclosed subject matter. The disclosed test process 400 provides an efficient testing process that saves time by foregoing the analog circuit response time of the current generating circuitry for each cell and testing the digital logic associated with each of the individual unit cells. The test process 400 may be implemented in a variety of configurations. The process 400 may include a decoder, such as decoder 310, being configured to address an individual unit cell of a plurality of unit cells of a digital-to-analog converter (410). For example, a test mode enable signal may be applied to the decoder and subsequently to individual unit cells, or directly to individual unit cells in the digital-to-analog converter. During normal operation, the circuits related to individual unit cells may have control signals or output setting signals, such as bias currents or mode setting signals that have a specific value or range of values. However, when in test mode, the control signals or output setting signals may have values or ranges of values that change the circuit configurations, and, as a result, the output signal values of the individual current elements may change accordingly. A specific unit cell of the plurality of unit cells may be selected for testing (420). For example, the plurality of unit cells may be arranged in an array, such as array 230 in FIG. 2. Each unit cell may occupy a position in a specific row and column, and be addressed by signals indicating the occupied row and column positions. The selection of one of the unit cells for testing may enable a test mode for the selected unit cell in which the selected unit cell provides a higher current than during a normal mode of operation. The selected unit cell may have both digital logic circuitry and analog current generating circuitry. A bias current to the selected cell may be increased for testing the selected cell (430). The bias current to the specific selected unit cell may be increased on an individual basis. In response to the increased bias, the gain of the selected unit cell may be increased during the testing of the digital-to-analog converter. For example, the signals selecting the individual cell for testing may also be supplied, or may cause another signal to be delivered, to circuitry that increases the bias to the individual selected unit cell. Alternatively, the bias current may be increased to all of the cells in the digital-to-analog converter at once. For example, when the digital-to-analog converter is placed in test mode, the bias current for all of the cells may be increased. As will be explained with reference to FIG. 5, the increased bias current may be provided to an additional gain circuit of the selected unit cell. This additional gain circuit may only be active during the test mode. Alternatively, the gain circuit may have circuit parameters that allow the gain to be modified in response to whether the digital-to-analog converter is in normal or test mode. When in test mode, the gain circuit of the selected unit cell may provide an increased gain to the output signal. In an implementation, only the logic circuitry and not the analog circuitry may be tested during the testing to determine whether the selected unit cell is not working properly. As a result, the output signal value may be higher when the bias signal is increased. A test logic signal may be applied to the logic circuitry of the selected unit cell (430). The applied test logic signal or other control signal may be used to open circuits to the analog circuitry, which prevents the generation of an analog current by the respective cell. In response to the applied test logic signal, the digital logic of the selected unit cell circuitry of the digital-to-analog converter may, if operating properly, output a "High" logic signal. The outputted "High" logic signal may be, due to the increased bias current, a current that is capable of generating a voltage across an appropriately sized resistive element that is equivalent to a threshold voltage for a "High" logic signal. The "High" logic signal may be delivered to a test result device that may indicate that the specific unit cell is operating properly. If the output signal from the digital-to-analog converter 200 is a "Low" logic signal, the test result device may indicate that the specific unit cell is not operating properly. By applying all of the digital input codes individually and checking the output, the logic of each cell can be tested.

The digital logic circuits may be CMOS devices that have a rapid and distinct ON/OFF point. As a result, the digital logic of the circuits may be tested quickly and with greater precision than the analog circuits of the respective unit cells. During testing, if an appropriate response from the digital logic circuit of a respective unit cell is received, it may be presumed that the respective unit cell including the analog circuitry is operating properly.

Figure 5:
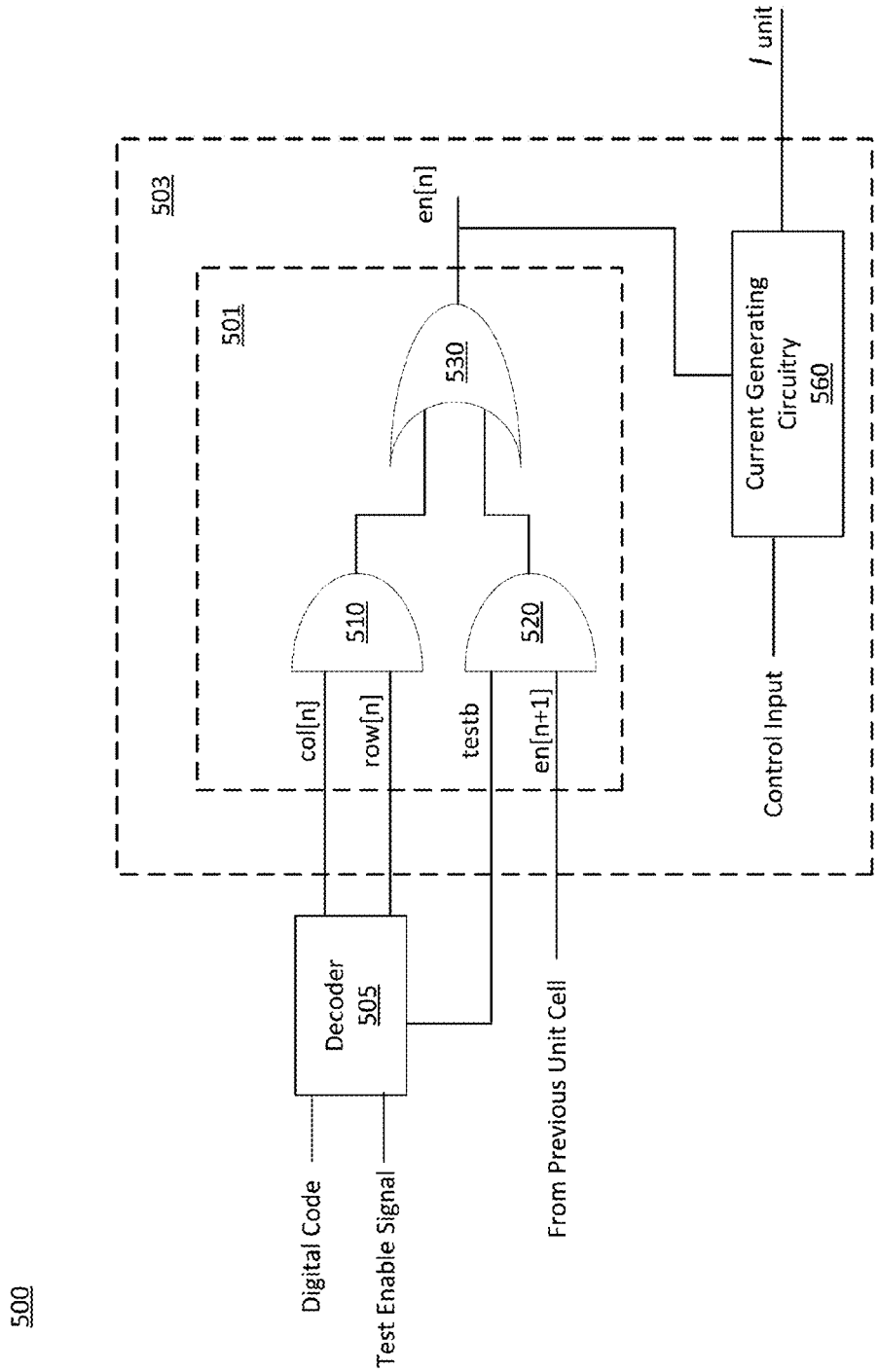
FIG. 5 shows an example of cell digital logic according to an implementation of the disclosed subject matter.

FIG. 5 illustrates an example implementation of enabling circuitry (or disabling circuitry) inside each of the respective unit cells 503. The unit cell 503 may be similar to unit cell 240 of FIG. 2 in an array of unit cells, such as array 230 of FIG. 2. In an example implementation, the unit cell 503 may include current generating circuitry 560 and digital logic circuitry such as enabling circuit 501. The current generating circuitry 560 may include control inputs, transistors and other circuit components and an output. The control input may, for example, include signals to alter circuit parameters and the configuration of transistors and other circuit components. The control input may also include the testb signal. The enabling circuit 501 may include AND gates 510, 520 coupled to an OR gate 530. Of course, other digital logic configurations may be used to implement the enabling circuit 501. The enabling circuit 501 as well as all of the other unit cells in an array of unit cells may be coupled to input and control circuitry, such as decoder 505. The decoder 505 may be implemented using decoders, such as one-hot decoders or decoders 215, 225. For example, the inputs of the AND gate 510 may be coupled to, for example, a decoder 505. Similarly, the inputs of AND gate 520 may be coupled to control circuitry, such as decoder 505 as well as other unit cells. For example, a unit cell (not shown) within an array of unit cells may be ahead of unit cell 503 and may provide its output to AND gate 520 of unit cell 501. In which case, the output signal en[n+1] may be a ripple signal (e.g., an enable signal) from the unit cell in front of unit cell 503 in the array of unit cells. The en[n+1] signal may be applied to one of the inputs of AND gate 520. The output of the AND gates 510 and 520 may be coupled to the inputs of the OR gate 530. Similar to respective unit cells 270 and 280 as illustrated in FIG. 2, the output of OR gate 530 of unit cell 503 may be coupled to a unit cell behind it in the array of unit cells.

In both normal mode and test mode operation, the output of the decoder 505 may indicate a particular unit cell at specific row (row[n]) location and column (col[n]) location is to be turned on. If unit cell 503 is the lead-most unit cell, the respective column (col[n]) and row (row[n]) inputs of the particular unit cell 501, such as element 323 illustrated in FIG. 3, may be logic "High." In response, the AND gate 510 may output a logical "High". The logical "High" may be applied to an input of OR gate 530. The OR gate 530 functions to pass the logic "High" at the input to the output as signal en[n]. The output signal en[n] may be output passed on as a ripple signal to other unit cells behind unit cell 503 in the array of unit cells. In normal mode, the testb signal applied to AND gate 520 is a logical "High."

Since, in this example, unit cell 503 is the lead-most unit cell, a logical "High" en[n+1] signal is not applied to the AND gate 520. As a result, the AND gate 520 outputs a logical "Low." Once turned on or enabled, the unit cell 503 provides its unit of current for the output to the array 230 or the DAC 200 and also sends its enable signal en[n] to the unit cell that is behind it, such as unit cell 270, in the array 230 so that the unit cell 270 can also be turned on or enabled. For example, the current generating circuitry 560 may generate an output current I in response to the enabling signal en[n] from the enabling circuit 501. Once turned on the current for the unit cell 503 is passed to the output of the array of unit cells.

While still in normal mode, unit cell 503 may not be the lead-most unit cell. If this particular unit cell, or current element, 503 is not the lead-most unit cell but a unit cell that follows, or is behind, the lead-most cell, such as unit cell 270 or 280 as shown in FIG. 2, the output of the AND gate 510 may be a logical "Low." The output of AND gate 510 is low because the specific column (col[n]) signal and row (row[n]) signals for this particular unit cell 503 are not being asserted and are not a logical "High." However, signal testb that is input to AND gate 520 may still be a logical "High." The enable signal en[n+1] may be propagated from, or ripple from, the output of a forward unit cell, such as unit cell 260. As a result, the output of the AND gate 520 is a logical "High" because both inputs, testb and en[n+1], are a logical "High." The logical "High" output from AND gate 520 may be applied to OR gate 530. In response to the applied "High" signal, the OR gate 530 may be output a logical "High" as signal en[n], which is passed on to the next unit cell in the array, if any.

In the above example implementations, the current generating circuitry 560 may output a current equal to I unit that will be summed with the current output from other unit cells in the array to output a final current value from the DAC based on the input digital code to the decoder 505. The current I unit may be based on a first bias current that is applied to the current generating circuitry 560. The first bias current may be pre-set or may be dynamically adjusted as the operating parameters of the DAC 500 change during operation.

With reference to FIG. 2, if, while in normal mode and if unit cell 503 is a unit cell that is somewhere in front of the lead-most current element 260 in the array 230, then neither the input from the AND gate 510 nor the input from the signal en[n+1] will be a logical "High." As a result, the output of the OR gate 530 will be a logical "Low." When the output of the OR gate 530 is a logical "Low," the unit cell 503 may not turn on and does not contribute to the output of the array of unit cells. Furthermore, the "Low" signal en[n] is passed on to the next unit cell following the unit cell 503, and in response, the following unit cell may also not be turned on. As a result, these unit cells do not contribute to the output of the array 230 or the DAC 500. The lead-most current element 260 is not affected by the low ripple signal received on the signal en[n+1] since the AND gate 510 will have a pair of "High" inputs from the row and column signals.

In test mode, digital codes may be applied to the decoder 505 to iteratively address individual unit cells 503 in an array of unit cells. Based on the digital code input into the decoder 505, the decoder 505 may select each of the unit cells one at a time to test respective logic circuitry of the selected unit cell one at a time. When in test mode, the normally "High" input signal testb may change to a logical "Low." The test mode may disrupt the downstream flow of the en[n], or ripple, signal and may also cause an increase in the current output of the individual unit cells above the normal I unit current value. Even though in test mode, a unit cell that receives a high row (row[n]) signal and column (col[n]) signal may generate an output signal en[n]. However, the distribution, or ripple, of the signal will be disrupted because the normally "High" testb signal is "Low" in test mode. As a result of the "Low" testb signal, the output from AND gate 520 in enabling circuit 501 will be a logical "Low." In effect, the test enable signal may cancel the previous unit cell.

In this case, only the unit cell 503 that is addressed by the row (row[n]) signal and column (col[n]) signal will generate an output signal en[n] for the DAC 500. In response, the current generating circuitry 560 will generate a test-mode current signal based on the output signal en[n] from the single addressed unit cell 503. The current output by the current generating circuitry 560 during test mode may have a higher current value than the current output during normal mode. This may be because the bias signal to the current generating circuitry 560 is increased to increase the gain of the unit current I unit when test mode is enabled. Alternatively, an additional gain circuit that may only be enabled in test mode may be used to provide further current gain. These methods, increased bias and additional gain circuitry, may be used to increase the current in the unit cell and can potentially be used individually or in combination. When the current from the single unit cell 503 is presented to the current-to-voltage conversion circuit, the output may be saturated, and a logical "High" may presented at the output of the DAC 500. A tester may use that output to determine if the logic is working properly.

The increased bias signal may be applied to all unit cells in the array of unit cells in the DAC 500 at a single time, or may be provided as each unit cell is selected by a decoder. In an implementation, a single unit cell may provide a full scale logic output signal due to the increased bias. For example, the output signal may be a logic voltage level within a range of approximately 3 to approximately 5 volts. More specifically, the output signal may a logic voltage level of approximately one of the following: 1.0 volt, 1.2 volts, 2.5 volts, 3.3 volts and 5 volts. The voltages in the range of 1-5 volts may be considered a standard logic voltage. For example, in normal mode, the output may be approximately +/−1V. However, if a single cell is not functioning properly, an output voltage may be difficult to detect. An output signal value for a single bit is greater during a test mode than an output signal value for a single bit during a normal mode of operation of the selected unit cell.

Implementations of the presently disclosed subject matter may be implemented in and used with a variety of components and network architectures. For example, the current generating circuit 560 may be implemented using a single ended implementation using a single switch or a differential implementation. The single ended implementation may provide a single conductive path controlled by the single switch. When the switch is "ON," current is conducted and when the switch is "OFF," current is not conducted. The differential implementation may be used to improve noise reduction of the DAC. To implement the differential input, another conductive path with a transistor complementary to the single end transistor and an additional switch may be used.

In an implementation, the operation of the ripple circuit logic may also be tested by addressing the top unit cell ($2^n-1$) in the array of unit cells. For example, the "test disabled" signal may be applied, the top cell ($2^n-1$) may be addressed, and it may be confirmed that the ripple output signal, or en[n] signal, is properly propagated through the array of unit cells by confirming the output of the bottom (0) cell, such as cell 250 in FIG. 2, is at an expected current level.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A method, comprising:
   configuring a decoder to address an individual unit cell of a plurality of unit cells of a digital-to-analog converter;
   selecting, by the configured decoder, a particular unit cell of the plurality of unit cells for testing, the selected unit cell having logic circuitry and analog circuitry;
   testing the selected unit cell by increasing a bias current of the selected unit cell, wherein the increased bias current of the selected unit cell during the testing is greater than the bias current of the selected unit cell during normal operation;
   applying a test logic signal to the logic circuitry of the selected unit cell; and
   in response to the test logic signal, outputting an output signal from the selected unit cell logic circuitry of the digital-to-analog converter.

2. The method of claim 1, wherein only the logic circuitry and not the analog circuitry is tested during the testing to determine whether the selected unit cell is not working properly.

3. The method of claim 1, wherein the increased bias increases gain of the selected unit cell during the testing of the digital-to-analog converter.

4. The method of claim 1, wherein selecting one of the unit cells for testing includes enabling a test mode for the selected unit cell in which the selected unit cell provides a higher current when selected during the test mode than during a normal mode of operation.

5. The method of claim 1, wherein enabling a test mode for the selected unit cell includes increasing gain of one or more circuits of the selected unit cell in response to the increased bias current to provide a test current signal that generates a test voltage at standard logic voltage levels for the first logic output.

6. The method of claim 1, comprising selecting, by the decoder, each of the unit cells one at a time to test respective logic circuitry of the selected unit cell one at a time.

7. The method of claim 1, wherein an output signal value for a single bit is greater during a test mode than an output signal value for a single bit during a normal mode of operation of the selected unit cell.

8. The method of claim 1, wherein the output signal is a logic voltage level of approximately one of the following: 1.0 volt, 1.2 volts, 2.5 volts, 3.3 volts and 5 volts.

9. The method of claim 1, wherein the output signal is a logic voltage level within a range of approximately 3 volts to approximately 5 volts.

10. The method of claim 1, further comprising:
    individually addressing each of the plurality of unit cells of the digital-to-analog converter.

11. The method of claim 1, further comprising:
    addressing a top unit cell in the array of unit cells, wherein the top unit cell is cell number $2^n-1$ in the array;
    applying a test disable signal; and
    confirming that the ripple output signal is properly propagated through the array on unit cells.

12. The method of claim 11, wherein the confirming comprises:
    confirming the output of a bottom cell in the array of the unit cells is generating an output signal at the proper level.

13. A device, comprising:
    a plurality of unit cells arranged in an array of rows and columns;
    a dynamically configurable row decoder coupled to the array of unit cells, wherein the row decoder has a row code input and logic circuitry;
    a dynamically configurable column decoder coupled to the array of unit cells, wherein the column decoder has a column code input and logic circuitry;
    a voltage generator coupled to the plurality of unit cells and to a device output terminal; and
    a logic test input coupled to the row decoder and the column decoder.

14. The device of claim 13, wherein a unit cell of the plurality of unit cells, comprises:
    an enabling circuit including digital logic circuitry; and
    current generating circuitry responsive to the generation of an enabling signal from the enabling circuit.

15. The device of claim 13, wherein the enabling circuit, comprises:
    inputs for receiving a column signal and a row signal;
    inputs for receiving an enabling signal from a previous unit cell in the array; and
    a test enable signal, wherein the test enable signal cancels the previous unit cell.

16. The device of claim 13, wherein the current generating circuitry is configured to provide varying current values in response to control inputs.

* * * * *